United States Patent [19]

Gupta et al.

[11] Patent Number: 5,681,616
[45] Date of Patent: Oct. 28, 1997

[54] THICK THERMAL BARRIER COATING HAVING GROOVES FOR ENHANCED STRAIN TOLERANCE

[75] Inventors: Bhupendra K. Gupta; Gilbert Farmer, both of Cincinnati, Ohio; Alan Walker, Niskayuna, N.Y.

[73] Assignee: General Electric Company, Cincinnati, Ohio

[21] Appl. No.: 568,719

[22] Filed: Dec. 7, 1995

Related U.S. Application Data

[62] Division of Ser. No. 365,635, Dec. 28, 1994, Pat. No. 5,558,922.

[51] Int. Cl.$^6$ ................................................. B05D 5/00
[52] U.S. Cl. ..................... 427/264; 427/272; 427/273; 427/287; 427/271
[58] Field of Search ............................ 427/271, 272, 427/273, 287, 264; 428/141, 142, 155, 632, 680, 681

[56] References Cited

U.S. PATENT DOCUMENTS

| | | | |
|---|---|---|---|
| 4,055,705 | 10/1977 | Stecura | 428/633 |
| 4,183,987 | 1/1980 | Eby et al. | 428/192 |
| 4,405,660 | 9/1983 | Ulion et al. | 427/248.1 |
| 4,658,683 | 4/1987 | Phillips | 83/53 |
| 5,073,433 | 12/1991 | Taylor | 428/134 |
| 5,161,305 | 11/1992 | Yamakawa | 29/846 |
| 5,236,745 | 8/1993 | Gupta | 427/45 |
| 5,350,599 | 9/1994 | Rigney et al. | 427/255.7 |
| 5,419,971 | 5/1995 | Skelly | 428/612 |
| 5,558,922 | 9/1996 | Gupta | 428/141 |

FOREIGN PATENT DOCUMENTS 0605196A 7/1994 European Pat. Off. .

OTHER PUBLICATIONS

Duvall et al., "Ceramic Thermal Barrier Coatings for Turbine Engine Components", ASME paper 82–GT–322 (1982).

Sumner et al., "Development of Improved–Durability Plasma Sprayed Ceramic ..." AIAA/SAE/ASME 16th Joint Prop. Conf., Jun. 30–Jul. 2 1980.

American Society of Mechanical Engineers paper 82–GT–322, "Ceramic Thermal Barrier Coatings for Turbine Engine Components", by Duvall et al., pp. 1–9.

*Primary Examiner*—Timothy Speer
*Attorney, Agent, or Firm*—Andrew C. Hess; Nathan D. Herkamp

[57] ABSTRACT

A thermal barrier coating is provided which is adapted to be formed on an article subjected to a hostile thermal environment while subjected to thermally, mechanically and/or dynamically-induced stresses, such as a component of a gas turbine engine. The thermal barrier coating is composed of a bond layer that tenaciously adheres an insulative ceramic layer to the article. The bond layer is formed of a metallic oxidation-resistant material, and has an average surface roughness $R_a$ of at least about 7.5 micrometers, while the ceramic layer is characterized by being segmented by at least two sets of grooves. The grooves have substantially uniform widths of about 100 to about 500 micrometers, with adjacent grooves of each set being spaced about 10 to about 250 millimeters apart. The grooves promote the resistance of the thermal barrier coating to spalling, and are selectively located in the ceramic layer in order to tailor the stress relaxation capability of the thermal barrier coating to the size, geometry and service environment of the article. A preferred method for forming the grooves involves a liquid jet technique by which a portion of the ceramic layer is abraded by a high pressure liquid stream.

7 Claims, 1 Drawing Sheet

THICK THERMAL BARRIER COATING HAVING GROOVES FOR ENHANCED STRAIN TOLERANCE

This application is a divisional application of U.S. patent application Ser. No. 08/365,635 filed Dec. 28, 1994, now U.S. Pat. No. 5,558,922.

This invention relates to thermal barrier coatings for components exposed to high temperatures, such as the hostile thermal environment of a gas turbine engine. More particularly, this invention is directed to a thick thermal barrier coating characterized by grooves which are sized and selectively spaced to enhance the strain tolerance of the thermal barrier coating resists spalling even when exposed to high stress conditions created by a combination of thermal, mechanical and dynamic stresses.

BACKGROUND OF THE INVENTION

Higher operating temperatures of gas turbine engines are continuously sought in order to increase the efficiency of such engines. As operating temperatures increase, the high temperature durability of the components of the engine must correspondingly increase. A common solution is to thermally insulate certain components of a gas turbine engine in order to minimize their service temperatures. For this purpose, thermal barrier coatings (TBC) formed directly on the surface of a component have found wide use. Such coatings generally entail the deposition of a metallic bond layer onto the surface of a component, followed by a ceramic layer which serves to thermally insulate the component. Preferably, the metallic bond layer is formed from an oxidation-resistant alloy in order to promote the adhesion of the ceramic layer to the component. Various ceramic materials have been employed as the ceramic layer, particularly zirconia ($ZrO_2$) stabilized by yttria ($Y_2O_3$), magnesia (MgO) or other oxides. These materials can be readily deposited by plasma spray techniques.

A primary objective of thermal barrier coating systems has been the formation of a more adherent ceramic layer which is less susceptible to spalling when subjected to thermal cycling. For this purpose, the prior art has proposed various types of coating systems, including the formation of ceramic layers having enhanced strain tolerance as a result of the presence of porosity, microcracks and segmentation of the ceramic layer. Microcracks generally denote random internal discontinuities within the ceramic layer, while segmentation indicates the presence of microcracks that extend through the thickness of the ceramic layer, thereby imparting a columnar structure to the ceramic layer.

As taught by Sumner et al. in an article entitled "Development of Improved-Durability Plasma Sprayed Ceramic Coatings for Gas Turbine Engines", published by the AIAA/SAE/ASME 16th Joint Propulsion Conference, Jun. 30 through Jul. 2, 1980, and Duvall et al. in an article entitled "Ceramic Thermal Barrier Coatings for Turbine Engine Components", ASME paper 82-GT-322, the presence of microcracks or segmentation can effectively serve as a strain relief mechanism for a thermal barrier coating, as evidenced by the results of controlled thermal cyclic testing.

Similarly, U.S. Pat. No. 5,073,433 to Taylor reports that the presence of vertical macrocracks homogeneously dispersed in a thermal barrier coating are capable of improving the thermal fatigue resistance of the coating. While Taylor employs the term "vertical macrocracks", Taylor's description depicts segmentation essentially identical to that of Sumner et al. and Duvall et al., with approximately 75 to 100 microcracks being present per linear inch of coating and each microcrack having a width of preferably less than ½ mil (about 13 micrometers).

A shortcoming of the above prior art is that the advantageous results obtained are generally restricted to strains thermally induced between the ceramic layer and the underlying substrate provided by the component. More specifically, the microcracks and segmentation provide strain relaxation for only local stresses, such as those generated by a mismatch in coefficients of thermal expansion of the ceramic layer and the substrate metal. As such, the microcracks are unable to provide adequate stress relaxation if the ceramic layer is relatively thick, such as on the order of about 0.75 millimeter or more, with correspondingly higher residual stresses.

The microcracks are also generally inadequate to provide protection from strains induced by a combination of thermal, mechanical and dynamic stresses, such as extremely high temperature gradients, compressive, tensile and hoop stresses, and vibrationally-induced stresses. When exposed to such conditions, large areas of the thermal barrier coating tend to spall or otherwise delaminate from the bond layer, because the microcracks do not provide sufficiently large discontinuities to arrest the propagation of cracks within the ceramic layer.

In addition, the methods by which the microcracks and segmentation are produced do not permit the location, spacing and size of the microcracks to be selectively controlled. As such, the thermal fatigue properties of components equipped with these thermal barrier coatings cannot be tailored to the specific geometry of a component or differences in operating environments at various locations on a component.

While the use of thermal barriers formed of ceramic tiles tends to solve some of the above shortcomings, their use is generally limited to relatively large articles whose applications warrant a relatively labor-intensive assembly procedure. However, weight consequences and adhesion is often a concern with ceramic tiles. Furthermore, ceramic tiles are unsuitable for protecting articles with complicated geometries.

Accordingly, it would be desirable to provide a thermal barrier coating characterized by the ability to resist spallation when subjected to hostile environments, particularly those in which a combination of thermal, mechanical and dynamic stresses are imposed. Preferably, such a coating would be capable of being tailored to specific applications in which the operating environment at various locations on an article may differ significantly, and in which the geometry of the article precludes the use of tiles.

SUMMARY OF THE INVENTION

It is an object of this invention to provide a thermal barrier coating for an article exposed to a hostile thermal environment while simultaneously subjected to thermal, mechanical and dynamic stresses.

It is a further object of this invention that such a thermal barrier coating be highly resistant to spallation, even when the coating thickness exceeds about 2.5 millimeters.

It is another object of this invention that such a thermal barrier coating be characterized by the presence of grooves that are selectively located on the article to form a grid pattern which provides strain relaxation over a broad surface area of the article.

It is yet an another object of this invention that such grooves serve as crack arresters that restrict spallation of the thermal barrier coating to a limited surface region of the article.

It is still a further object of this invention to provide a method for forming such a thermal barrier coating.

The present invention generally provides a thermal barrier coating which is adapted to be formed on an article subjected to a hostile thermal environment while subjected to thermally, mechanically and dynamically-induced stresses, such as components of a gas turbine engine. The thermal barrier coating is composed of a bond layer overlaying the surface of the article, and a ceramic layer on the bond layer. The bond layer serves to tenaciously adhere the ceramic layer to the article, while the ceramic layer serves as a thermal insulator to the article.

The bond layer is formed of a metallic oxidation-resistant material, and has an average surface roughness $R_a$ of at least about 7.5 micrometers (about 300 microinches). The ceramic layer is characterized by being segmented by grooves that are arranged to define a grid in the surface of the ceramic layer. The grooves have substantially uniform widths of about 100 to about 500 micrometers, with adjacent grooves being spaced about 10 to about 250 millimeters apart. A preferred material for the ceramic layer is an yttria-stabilized zirconia, while a preferred material for the bond layer is a nickel-base alloy.

In accordance with this invention, the thermal barrier coating is advantageously resistant to spalling due to the presence of the grooves in the ceramic layer. This capability exists even when the coating thickness exceeds about 2.5 millimeters. The grooves are preferably formed after the ceramic and bond layers have been deposited, and are selectively located in the ceramic layer in order to tailor the stress relaxation capability of the thermal barrier coating to the size, geometry and service environment of the article. A preferred method for forming the grooves involves a liquid jet technique by which a portion of the ceramic layer is abraded by a high pressure liquid stream.

Notably, the grooves of this invention are significantly larger than that taught by the prior art, and are spaced apart a greater distance than that possible with the prior art. As a result, the grooves enable the thermal barrier coating to provide stress relaxation over a broad surface area of the article on which the thermal barrier coating is formed. The grooves are also capable of a higher level of stress relaxation, such as that imposed by a combination of thermally, mechanically and dynamically-induced stresses. The location and spacing of the grooves enable the thermal barrier coating to be tailored to applications in which the operating environment at various locations on the article may differ significantly, and in which the geometry of the article precludes the use of tiles. Finally, the grooves act as crack arresters, such that spallation of the thermal barrier coating will be restricted to a limited surface region of the article.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which.

DETAILED DESCRIPTION OF THE INVENTION

Figure 1:
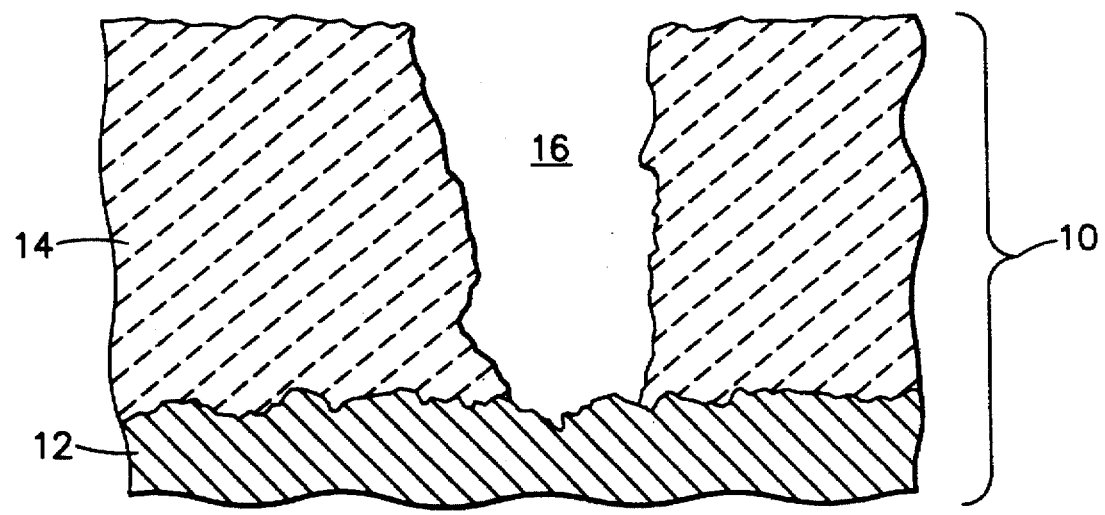
FIG. 1 shows a representation of a cross-sectional portion of an article on which a thermal barrier coating is formed in accordance with this invention.

The present invention is generally directed to metal components that operate within environments characterized by relatively high temperatures, in which the components are subjected to a combination of thermal, mechanical and dynamic stresses. Examples are the stator vanes, turbine blades and combustor liners of a gas turbine engine, which are subjected to a combination of such stresses within the operating environment of the engine. While the advantages of this invention will be illustrated and described with reference to components of gas turbine engines, the teachings of this invention are generally applicable to any component in which a thermal barrier can be used to insulate the component from a hostile thermal environment.

To illustrate the invention, a cross-sectional representation of an article coated with a thermal barrier coating is shown in FIG. 1. As is conventional, the article may be formed from a nickel-base superalloy or another suitable high temperature material. According to this invention, the article is thermally insulated from its hostile thermal environment by a thermal barrier coating 10 which is uniquely adapted to be resistant to spalling and delamination as a result of high stresses being imposed over large areas of the article.

The coating 10 is composed of a bond layer 12 over which a ceramic layer 14 is formed. The bond layer 12 is preferably formed of a metallic oxidation-resistant material, such that the bond layer 12 will be resistant to oxidation and will therefore be capable of more tenaciously adhering the ceramic layer 14 to the article. A preferred bond layer 12 is formed by a nickel-base alloy powder, such as NiCrAlY, which has been deposited on the surface of the article to a thickness of about 0.125 to about 0.375 micrometers.

A preferred deposition method is an air plasma spray technique, though it is foreseeable that other deposition methods such as physical vapor deposition (PVD) could be used. Importantly, the alloy powder preferably has a coarse particle size, such as on the order of about 50 to about 150 micrometers. The intent is to generate a bond layer 12 whose average surface roughness $R_a$ is at least about 7.5 micrometers (about 300 microinches), as measured in accordance with standardized measurement procedures. According to the present invention, a surface roughness of at least about 7.5 micrometers is necessary to achieve a suitable bond between the ceramic layer 14 and the bond layer 12.

The ceramic layer 14 is also preferably deposited by an air plasma spray technique. A preferred material for the ceramic layer 14 is an yttria-stabilized zirconia, a preferred composition being 8 weight percent yttria and 92 weight percent zirconia, though other ceramic materials could foreseeably be used. The ceramic layer 14 is deposited to a thickness that is sufficient to provide the required thermal protection for the article. In accordance with this invention, thicknesses of about 2.5 millimeters and greater are possible, contrary to prior art thermal barrier coatings whose thicknesses are limited by residual stresses that would promote spalling and delamination of the coating when subjected to thermal cycling.

To achieve adequate stress relaxation, the ceramic layer 14 of this invention is segmented by grooves 16, one of which is shown in FIG. 1. The grooves 16 are formed in the ceramic layer 14 to create a grid pattern composed of two substantially parallel sets of grooves 16, the grooves 16 of one set being nonparallel to the grooves 16 of the other set. The sets of grooves 16 can be, but are not required to be, perpendicular to each other. The grooves 16 are preferably formed after the bond and ceramic layers 12 and 14 have been deposited on the article. A preferred method for defining the grooves 16 uses a water jet which cuts the grooves 16 in the ceramic layer 14 without harming the underlying surface of the article.

As shown in FIG. 1, the groove 16 extends down to the bond layer 12 without causing any degradation of the bond coat quality, such as crack propagation through the bond layer 12 and into the surface of the article. However, the depth of the grooves 16 need not extend to the bond layer 12, and can vary for the purpose of tailoring the coating 10 to stress conditions in particular regions of the article. While FIG. 1 shows a somewhat nonuniform taper to the walls of the groove 16, improvements in the uniformity of the groove shape and size can be accomplished by modifying the water jet cutting technique. Overall, the grooves 16 are very uniform as compared to the random internal discontinuities which characterize the microcracks and segmentations of prior art thermal barrier coatings.

Grooves 16 formed in accordance with this invention have substantially uniform widths of about 100 to about 500 micrometers, and adjacent grooves 16 within each set are spaced about 10 to about 250 millimeters apart. The preferred groove width and spacing are required to achieve a suitable stress relaxation capability over a broad surface region of the article, as is necessary to endure significant thermally, mechanically and dynamically-induced stresses, and stresses which are a combination thereof.

Notably, the ability to selectively locate the grooves 16 on the article enables the stress relaxation capability of the thermal barrier coating 10 to be tailored to the size, geometry and service environment of the article. In contrast, the wholly random and uncontrollable formation of the microcracks of the prior art make such an advantage impossible to achieve.

A preferred method for forming the thermal barrier coating 10 of this invention is generally as follows. The surface of the article is first prepared by grit blasting with alumina particles. The bond layer 12 is then deposited in a conventional manner using an air plasma spray deposition technique. As noted above, the material which forms the bond layer 12 is preferably in the form of a coarse powder, and the resulting bond layer 12 preferably has an average surface roughness $R_a$ is at least about 7.5 micrometers.

The ceramic layer 14 is then deposited by air plasma spraying on the bond layer 12 with a suitable ceramic material. For some applications, a adequate thickness for the thermal barrier coating 10 is about 0.75 millimeter though, according to this invention, spall-resistant coatings 10 of about 2.5 millimeters and greater can be achieved to provide considerably improved thermal insulation. The grooves 16 are then formed by directing a high pressure liquid jet at the surface of the ceramic layer 14. In practice, water at a pressure of about 100 to about 200 MPa (about 15,000 to about 30,000 psi) and directed through an orifice of about 0.125 millimeter in diameter has been found to achieve a satisfactory cutting action, though it is foreseeable that other parameters and fluids could be used.

However, it is foreseeable that various other techniques could be used to precisely define the grooves 16 required by this invention. Such techniques include mechanical cutters, such as a diamond wheel or knife, and the use of fine wires which are embedded in the ceramic layer 14 during the deposition process and later removed. After the grooves 16 are formed, the article preferably undergoes a vacuum heat treatment at about 1080° C. for a duration of about four hours for the purpose of stress relieving the thermal barrier coating 10.

The durability of thermal barrier coatings 10 formed in accordance with this invention was investigated by coating an approximately 250 by 250 millimeter (10 by 10 inch) substrate of IN-718 nickel-chromium alloy in accordance with the above. The bond layer 12 was that of the preferred oxidation-resistant nickel-base NiCrAlY alloy, while the ceramic layer 14 was the preferred 8% yttria-stabilized zirconia. The thickness of the coating was about 0.75 to about 1 millimeter.

The grooves were then defined in the substrate using the preferred water jet technique with process parameters of about 100 to about 170 MPa pressure, and a nozzle orifice diameter of about 0.125 millimeter. The grooves were formed in a grid pattern composed of two sets of grooves oriented substantially perpendicular to each other, and with grooves within each set being spaced about 50 millimeters (2 inches) apart. The widths of the grooves were approximately 0.25 to about 0.5 millimeter (about 0.01 to about 0.2 inch). Three 25 millimeter (one inch) diameter specimens, each containing an intersection between two grooves, were then cut by water jet from the substrate and tested for thermal shock resistance.

The test entailed cyclicly exposing the specimens to a temperature of about 1400° C. (2550° F.), followed by rapidly cooling the specimens to about 425° C. within a period of about twenty seconds. Each of the specimens successfully completed 2000 cycles without any bondline cracking being evident. Accordingly, the grooves were able to provide stress relaxation for a relatively thick thermal barrier coating. Notably, microcrack techniques taught by the prior art are inadequate for protecting such thick thermal barrier coatings (about 0.75 millimeter and more) due to the correspondingly higher residual stresses that are inherent at such thicknesses.

From the above, it can be seen that a significant advantage of this invention is that the thermal barrier coating 10 exhibits desirable thermal fatigue properties, as evidenced by the described thermal shock resistance test. The desirable thermal fatigue properties of the tested thermal barrier coating were attributed to the grooves which, according to this invention, were selectively located in the coating, were significantly larger than that taught by the prior art, and were spaced apart a greater distance than that possible with the prior art. As a result, the grooves pattern of this invention provides stress relaxation over a broad surface area of the article on which the thermal barrier coating is formed, even where the coating thickness is in excess of about 0.75 millimeter.

In addition, the grooves 16 of this invention are also capable of a higher level of stress relaxation, such as that imposed by a combination of thermally, mechanically and dynamically-induced stresses. The selective location and spacing of the grooves 16 enable the thermal barrier coating 10 to be specifically tailored to applications in which the operating environment at various locations on an article may differ significantly, and in which the geometry of the article precludes the use of tiles. Finally, the grooves 16 of this invention are sized and defined in a manner which enables them to serve as crack arresters, such that spallation of the thermal barrier coating 10 will be restricted to a limited surface region of the article.

While our invention has been described in terms of a preferred embodiment, it is apparent that other forms could be adopted by one skilled in the art, such as by substituting other suitable materials, by utilizing various methods for depositing or forming the bond and ceramic layers, or by utilizing various methods for forming the grooves. Accordingly, the scope of our invention is to be limited only by the following claims.

What is claimed is:

1. A method for forming a thermal barrier layer on an article, the method comprising the steps of:

forming a metallic oxidation-resistant bond layer on a surface of the article such that the bond layer has an average surface roughness $R_a$ of at least about 7.5 micrometers;

forming a ceramic layer which adheres to the bond layer; and segmenting the ceramic layer by selectively forming a grid pattern comprising at least two sets of grooves in the ceramic layer, the grooves of each of the at least two sets of grooves having substantially uniform widths of about 100 to about 500 micrometers, adjacent grooves within each of the at least two sets of grooves being spaced apart about 10 to about 250 millimeters.

2. A method as recited in claim 1 wherein the segmenting step comprises cutting the ceramic layer with a jet of liquid.

3. A method as recited in claim 1 wherein the at least two sets of grooves produced by the segmenting step are approximately perpendicular to each other.

4. A method as recited in claim 1 wherein the bond layer is formed from a nickel-base metallic powder and the ceramic layer is formed from an yttria-stabilized zirconia.

5. A method as recited in claim 1 wherein the ceramic layer is deposited to a thickness of at least about 0.75 millimeter.

6. A method as recited in claim 1 wherein the segmenting step comprises forming the grooves to extend to the bond layer.

7. A method as recited in claim 1 wherein the step of forming the ceramic layer comprises a plasma spray technique.

* * * * *